United States Patent [19]

Kobrosly et al.

[11] Patent Number: 5,631,857
[45] Date of Patent: May 20, 1997

[54] MEASURING TEST TOOL EFFECTIVENESS

[75] Inventors: Walid M. Kobrosly, Round Rock; Anthony M. Cristofich, Austin, both of Tex.

[73] Assignee: International Business Machines Corporation, Armonk, N.Y.

[21] Appl. No.: 260,124

[22] Filed: Jun. 15, 1994

[51] Int. Cl.$^6$ .................................................. G06G 7/12
[52] U.S. Cl. ........................................... 364/581; 364/488
[58] Field of Search ........................... 395/700; 364/581, 364/582, 575, 550, 551.01, 488, 489, 490, 491

[56] References Cited

U.S. PATENT DOCUMENTS

| | | | |
|---|---|---|---|
| 5,265,249 | 11/1993 | Kumamoto | 395/650 |
| 5,265,254 | 11/1993 | Blasciak et al. | 395/700 |
| 5,274,797 | 12/1993 | Barlow et al. | 395/575 |
| 5,351,202 | 9/1994 | Kurtzberg | 364/552 |
| 5,361,355 | 11/1994 | Kondo et al. | 395/700 |

OTHER PUBLICATIONS

Roberts, "Protocol Test Tools: Maintaining Quality and Competitiveness", *Telecommunications*, vol. 26, No. 11, Nov. 1992, pp. 48–54.

Faga, "A Data Model for Program Understanding", IBM document number TR 78.0259, pp. 689–702.

Frans de Jong, "Boundary Scan Test Used at Board Level", *Proceedings International Test Conference*, 1990, pp. 235–242.

Bering et al., "Software Testing—Concepts and Approach", *IEEE Proceedings of the National Aerospace and Electronics Concerence*, pp. 750–756.

Holloway, "The Open Systems Testing Consortium", *British Telecom Technology Journal*, Jan. 1993, pp. 153–157.

Vidovic, "Cross–development Software Needs Muscle . . . ", *Electronic Engineering Times*, Aug. 16, 1993.

Abadir, "TIGER: Testability Insertion Guidance Expert System", *IEEE International Conference Computer Aided Design*, 1989, pp. 562–565.

Rafiq, "The Astride Testing Approach: Principles, Tools and Carrying Out", *Computer Standards & Interfaces*, 1990, vol. 11, No. 2, pp. 85–94.

Hatch et al., "An Integrated Test Case Development and Execution Environment", *IBM Technical Report*, TR77.0258, Jun. 1990, pp. 1–25.

Van Asten, "Multi–Interface Verification Software Process", *IBM Technical Report*, TR54.716, Nov. 1992, pp. 1–16.

Shockley, "Guide to Writing BRAVE II Exercisers", *IBM Technical Report*, TR54.744, pp. 1–36.

Woollard, "Verification and Testing", *British Telecom Technology Journal*, vol. 11, No. 1, Jan. 1993, pp. 158–167.

Skibbe, "PACE—A Microprogram Evaluation System", *Proceedings of the 15th Annual IEEE Workshop on Microprogramming*, Oct. 1982, pp. 181–191.

*Primary Examiner*—Kevin A. Kriess
*Attorney, Agent, or Firm*—Lynn L. Augspurger

[57] ABSTRACT

A system for assessing the test effectiveness of a test tool for testing a computer system is described. The computer system is first subdivided into a plurality of functional components. For each of the functional components, a set of numbers is determined, each number corresponding to a plurality of factors indicating the effectiveness of the test tool. Based on the determined numbers, a normalized weight of the set of numbers for each of the functional components is computed. Then, based on the normalized weight for each of the functional components, a component test value for the test effectiveness of the test tool in testing each of the functional components is computed. Based on the normalized weight and the component test value for each of the functional components, an overall test value for the test effectiveness of the test tool in testing the computer system hardware is computed. Finally, the test tool is modified to improve the test effectiveness, based on the component test values and the overall test value. The system could be applied to identify weak areas of test coverage for the purpose of re-allocating coding efforts and resources.

14 Claims, 1 Drawing Sheet

MEASURING TEST TOOL EFFECTIVENESS

FIELD OF THE INVENTION

This invention is related to testing of computers and computer systems and particularly to assessing the effectiveness of test tools used in the testing of computers and computer systems.

GLOSSARY OF TERMS

While dictionary meanings are also implied by certain terms used here, the following glossary of some terms may be useful.

| | |
|---|---|
| Test Tool: | A control program and all the needed hardware and software applied to test the functions of a computer system. Test tools may execute test cases on an individual basis (one at a time), or on a continuous basis. |
| Test Case: | A set of instructions which has a specific objective and which is executed by a test tool. |
| Component: | A part of a computer system (or sub-system) performing a unique task. |
| Function: | A part of a component performing a unique task. |
| Number of Circuits: | An estimated number of newly developed gates. For circuits ported from other systems, the number only includes the gates developed to interconnect with the ported circuits. |
| Importance of a Component: | Is a number between 0 and 100 representing the relative importance of a component with respect to the rest of the components in a system. A 0 indicates that a component is the least important, and a 100 indicates that it is the most important. |
| Complexity of the Design Effort of a Component: | Is a number between 0 and 100 representing the relative complexity of designing a component with respect to designing the rest of the components of a computer system. A 0 indicates that a design effort of a component is the least complex, and a 100 indicates that it is the most complex. |
| Test Case Effectiveness: | Is a number between 0 and 100 representing the perception of the test case programmer, and the corresponding hardware or software developer, of how effective a group of test cases is in testing a function based on: The level of coverage (i.e. how much coverage) The quality of coverage (i.e. how good is the coverage) A 0 indicates that a group of test cases are the least effective, and a 100 indicates that they are the most effective. |
| Code Completeness of a Group of Test Cases: | Is a number between 0 and 100 representing the test case programmer perception of how complete a group of test cases are based on the overall target. A 0 indicates that the coding of a group of test cases has not yet started, and a 100 indicates that it is completed. |

BACKGROUND OF THE INVENTION

The normal practice in the use of test tools has been in the automatic generation, management and execution of test cases. Current test tools can shorten test duration, or increase the scope of the test by the use of several and possibly overlapping test tools. Test coverage tools are used in software, but are not currently suitable for use on hardware.

Accordingly, it would be desirable to provide a system for assessing the effectiveness of a test tool used to test a computer system, and mathematical modelling can be used to make the assessment.

The following publications provide background for the invention, and are cited in full in the following section. A brief discussion of each follows.

R. E. Skibbe (1) presents a tool (PACE) for evaluating microprograms which can be used to measure testing coverage of microprograms. PACE provides a useful technique for measuring the coverage of of microprograms, or software, but it is highly unsuitable for measuring hardware functions.

K. Woollard (2) discusses verification topics for testing Broadband Networks. The article emphasizes the semi-automatic generation of tests, and the problems associated with the test generation.

E. D. Shockley (3) discusses the BRAVE II tool and test cases for testing and test automation.

G. Van Asten (4) discusses the BRAVE tool for testing and test automation.

R. C. Hatch (5) discusses the development of an integrated test environment, which consists of a test case manager, test case library system, test case migration facility, for the development, execution, storage and migration of test cases.

O. Rafiq (6) investigates the applicability of the Astride Testing Approach by using the ISO Conformance Testing Terminology.

M. S. Abadir (7) provides an overview of a knowledge-based testability insertion guidance expert system for creating complex and testable designs. The system identifies testability problems, formulates a test strategy for the design, and plans the invocations of gate-level test tools.

Unlike our proposed invention, these articles (2–7) do not address mathematical modeling for assessing the test effectiveness of test tools.

N. Vidovic (8) discusses software design and verification. The use of several test tools and software test techniques as well as data collection and analysis are also discussed.

E. B. Holloway (9) discusses the work of the Open System Testing Consortium, which ensures the conformance of test services and the recognition of test results between test members.

C. A. Bering and J. H. Covey (10) discuss the use of test objectives, test documentation requirements, and automated test tools in the testing process.

F. de Jong (11) addresses test pattern generation, the data flow around this generation software, and the format of test vectors in board-level circuit design. The author presents a program for checking correctness of vectors and PC-based Boundary Scan Testing (BST) validation tool for addressing the needs of designers.

J. F. Faga (12) discusses a process for program (software) understanding (comprehend the logic, flow, and structure of source program code) for the purpose of design recovery, re-engineering, test tools and design tools development, etc.

M. Roberts (13) discusses improvements in the development and use of test tools running under the UNIX Platform by using Windows.

The coverage of these articles (8–13) is different than our invention because they do not address methods for assessing test coverage effectiveness of test tools for testing the hardware and software of computer systems.

None of the mentioned prior art references teaches, claims or even suggests mathematical modelling for assessing the effectiveness of a test tool which is used to test a computer system.

Prior art: Publications and Other

1. R. E. Skibbe, "PACE-A Microprogram Evaluation System," Proceedings of the 15th Annual IEEE Workshop on Microprogramming, Palo Alto, Calif., October, 1982, pp 181–191.

2. K. Woollard, "Verification and Testing," British Telecom Technology Journal, Vol. 11, No. 1, January 1993, pp. 158–167.

3. E. D. Shockley, "Guide to Writing BRAVE II Exercisers," IBM Technical Report TR-54.744, Boca Raton, Fla., unpublished.

4. G. Van Asten, "Multi-Interface Verification Software Process," IBM Technical Report TR-54.716, Boca Raton, Fla., unpublished.

5. R. C. Hatch, et al., "An Integrated Testcase Development and Execution Environment," IBM Technical Report TR-77.0258 Boulder, Colo., unpublished.

6. O. Rafiq, "Astride Testing Approach. Principles, Tools and Carrying Out," Computer Standard Interfaces, Vol. 11, No. 2, 1990, pp. 85–94.

7. M. S. Abadir, "TIGER: Testability Insertion Guidance Expert System," IEEE International Conference on Computer Aided Design," 1989, pp. 562–565.

8. N. Vidovic, "Cross-Development Software Needs Muscle," Electronic Engineering Times, Aug. 16, 1993, p. 46–49.

9. E. B. Holloway, "Open System Testing Consortium," British Telecommunication Technology Journal, Vol. 11, No. 1, January 1993, pp. 153–157.

10. C. A. Bering and J. H. Covey, "Software Testing—Concepts and Approach," IEEE Proceedings of the National Aerospace and Electronics Conference, Vol. 2, 1991, pp. 750–756.

11. F. de Jong, "Boundary Scan Test Used at Board Level: Moving Towards Reality," Proceedings-International Test Conference, 1990, pp.235–242.

12. J. F. Faga, "A Data Model for Program Understanding," IBM Technical Report TR-03.415 Sterling Forest, N.Y., unpublished.

13. M. Roberts, "Protocol Test Tools: Maintaining Quality and Competitiveness," Telecommunications (Int. Ed.) (USA), Vol. 26, No. 11, November 1992, p. 48, 52, 54.

SUMMARY OF THE INVENTION

It is the general object of the invention to provide methods for assessing the effectiveness of a test tool used to test a computer system.

The improvements which we have made achieve a quantitative method for assessing the effectiveness of test tools based on the planned, coded and executed test cases of the test tool. The invention also serves as an early indicator of the expected weak areas (components) of a computer system in terms of test completeness, for re-allocating coding efforts and resources, and to plan for the use of additional test tools.

The computer system is first subdivided into a plurality of functional components. For each of the functional components, a set of numbers is determined, each number corresponding to a plurality of factors indicating the effectiveness of the test tool. Based on the determined numbers, a normalized weight of the set of numbers for each of the functional components is computed. Then, based on the normalized weight for each of the functional components, a component test value for the test effectiveness of the test tool in testing each of the functional components is computed. Based on the normalized weight and the component test value for each of the functional components, an overall test value for the test effectiveness of the test tool in testing the computer system hardware is computed. Finally, the test tool is modified to improve the test effectiveness, based on the component test values and the overall test value.

This methodology can be expanded to include a number of test tools. This can be done by weighing all the tools to be used during a test cycle, and assigning a relative weight to each test tool. This is followed by assessing the test coverage effectiveness of each tool and determining the overall test coverage of all test tools applied in testing a computer system.

These and other improvements are set forth in the following detailed description. For a better understanding of the invention with advantages and features, refer to the description and to the drawings.

The detailed description explains the preferred embodiments of our invention, together with advantages and features, by way of example.

DETAILED DESCRIPTION OF THE INVENTION

Figure 1:
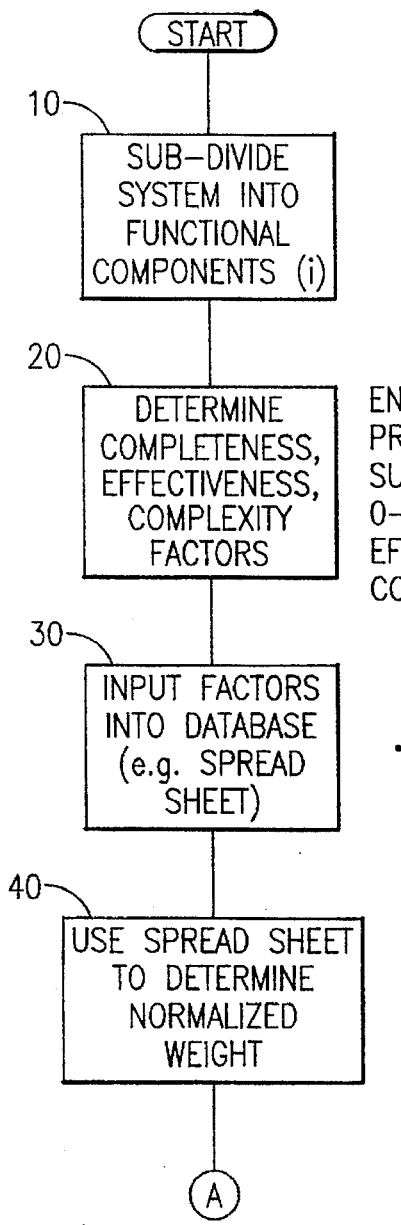
FIGS. 1 and 2 together depict in the form of a flowchart the method for assessing the effectiveness of a test tool used to test a computer system.
Figure 2:
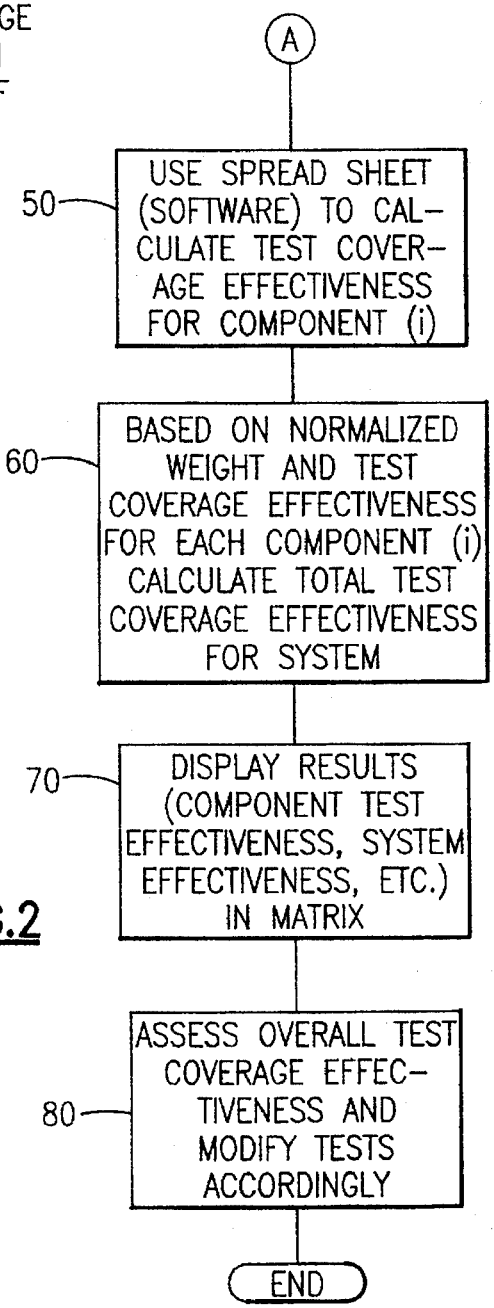

The depicted process illustrated in FIGS. 1 and 2 may be readily implemented as a set of software programs that, together with the computer hardware on which the software is executed, constitute means for performing the various functions depicted in the drawings.

Before considering our preferred embodiments in detail, it may be worthwhile to illustrate the invention with an example test tool, which was applied to test a computer system. To assess the Test Coverage Effectiveness of the test tool, the computer system was divided into six components as follows:

1. Memory Controller
2. Memory and System Controller
3. I/O Functions
4. I/O Controller
5. Graphics Functions
6. Digital to Analog Convertor (DAC)

The test tool was not designed to explicitly test the Processor Unit (PU) Component. Consequently, the PU was not included in this analysis. However, due to the importance of the PU, the evaluation of the relative complexity and importance of the six components included the processor.

For each of the six components, the respective developers and test case programmers were interviewed to determine the number of circuits, the Importance and Complexity, the normalized weight and the test cases' Effectiveness and Completeness The data and the Test Coverage Effectiveness analysis of the six components is shown in Table 1 on page 11.

TABLE 1

Analysis of the Computer System

| Evaluated Components | CC | NCC | Complx | Imprtnc | W | NWC | TEC | TECR |
|---|---|---|---|---|---|---|---|---|
| Memory Contrlr | 30.50k | 0.11 | 40 | 60 | 11.00 | 0.12 | 83.26 | 10.00 |
| Mem & System Contrlr | 24.30k | 0.08 | 40 | 60 | 8.00 | 0.09 | 66.85 | 6.02 |
| I/O Functions | 23.00k | 0.08 | 20 | 40 | 4.80 | 0.05 | 76.04 | 3.80 |
| I/O Contrlr | 32.62k | 0.11 | 50 | 70 | 13.20 | 0.15 | 42.30 | 6.34 |
| PU | * | * | 100 | 100 | * | * | * | * |
| Graphics Functions | 117.20k | 0.41 | 50 | 40 | 36.90 | 0.41 | 26.13 | 10.71 |
| DAC | 58.00k | 0.20 | 40 | 40 | 16.00 | 0.18 | 23.07 | 4.15 |
| Totals | 285.62k | 1.00 | | | 89.90 | 1.00 | | 41.02 |

CC The Circuit Count of a Component
NCC The Normalized Circuit Count
Complx The Complexity Value
Imprtnc The Importance Value
W The Weight of a Component
NWC The Normalized Weight of a Component
TEC The Test Coverage Effectiveness of a Component
TECR The Relative Test Coverage Effectiveness of a Component
Note: *Estimating the Relative Complexity and Importance of the Evaluated Components included the 601 CPU Chip The Test Coverage Effectiveness analysis of the test tool on the six evaluated components, and based on the conducted surveys is shown in Table 2 on page 12 through Table 7 on page 15.

TABLE 2

Memory Controller

| Major Function | CC | NCC | Complx | Imprtnc | W | NWF | Effect | Complt | CE | TEF |
|---|---|---|---|---|---|---|---|---|---|---|
| Bus Data Steering | 0.50k | 1.64 | 40 | 90 | 213.20 | 0.01 | 40 | 100 | 40 | 0.56 |
| Chip I/O Boundary | 4.50k | 14.75 | 20 | 20 | 590.00 | 0.04 | 0 | 0 | 0 | 0 |
| ECC | 5.00k | 16.40 | 100 | 90 | 3116.00 | 0.20 | 100 | 70 | 70 | 14.00 |
| ITHACA/IRIS Interlace | 1.50k | 4.92 | 100 | 100 | 984.00 | 0.06 | 95 | 100 | 95 | 5.70 |
| Queue to Memory Control | 5.50k | 18.05 | 100 | 100 | 3610.00 | 0.23 | 100 | 100 | 100 | 23.00 |
| Queue to 601 Data Path | 5.50k | 18.05 | 100 | 100 | 3610.00 | 0.23 | 100 | 80 | 80 | 18.40 |
| Register Control Syndrome | 1.00k | 3.28 | 40 | 70 | 360.80 | 0.02 | 100 | 80 | 80 | 1.60 |
| Byte Load/Store | 8.00k | 26.33 | 50 | 70 | 3147.60 | 0.20 | 100 | 100 | 100 | 20.00 |
| Totals | 30.50k | 100.00 | | | 15631.60 | 1.00 | | | | 83.26 |

CC The Circuit Count of a Component
NCC The Normalized Circuit Count
Complx The Complexity Value
Imprtnc The Importance Value
W The Weight of a Function
NWF The Normalized Weight of a Function
Effect The Effectiveness Points of a Function
Complt The Completeness Points of a Function
CE The Current Effectiveness of a Function
TEF The Test Coverage Effectiveness of a Function
Note: The BUD Test Coverage Effectiveness of the Memory Controller is 83.26%.

TABLE 3

Memory and System Controller

| Major Function | CC | NCC | Complx | Imprtnc | W | NWF | Effect | Complt | CE | TEF |
|---|---|---|---|---|---|---|---|---|---|---|
| Boot RAM | 3.00k | 0.12 | 40 | 100 | 16.80 | 0.11 | 0 | 0 | 0 | 0 |
| Checkstop Handling | 0.10k | 0.004 | 10 | 10 | 0.08 | 0.005 | 0 | 0 | 0 | 0 |
| DRAM Refresh | 1.00k | 0.04 | 60 | 100 | 6.40 | 0.04 | 100 | 100 | 100 | 4.00 |
| Load/Store Pacing | 0.20k | 0.008 | 70 | 80 | 1.20 | 0.007 | 100 | 100 | 100 | 0.70 |
| Memory Control Signal | 4.00k | 0.16 | 100 | 100 | 32.00 | 0.20 | 100 | 100 | 100 | 20.00 |
| Memory Registers | 2.00k | 0.08 | 50 | 70 | 9.60 | 0.06 | 100 | 100 | 100 | 6.00 |
| NVRAM | 2.00k | 0.08 | 40 | 75 | 9.20 | 0.06 | 80 | 100 | 80 | 4.80 |
| Operator Panel LED's | 0.50k | 0.02 | 30 | 50 | 1.60 | 0.01 | 100 | 100 | 100 | 1.00 |
| Page Mode Address | 3.50k | 0.14 | 100 | 100 | 28.00 | 0.18 | 0 | 0 | 0 | 0 |

TABLE 3-continued

| | Memory and System Controller | | | | | | | | | |
|---|---|---|---|---|---|---|---|---|---|---|
| Major Function | CC | NCC | Complx | Imptrtnc | W | NWF | Effect | Complt | CE | TEF |
| Control | | | | | | | | | | |
| System Arbiter | 2.50k | 0.10 | 100 | 100 | 20.00 | 0.13 | 95 | 100 | 95 | 12.35 |
| System Interrupt | 3.50k | 0.14 | 100 | 100 | 28.00 | 0.18 | 85 | 100 | 85 | 15.3 |
| Time of Day | 2.00k | 0.08 | 40 | 20 | 4.80 | 0.03 | 90 | 100 | 90 | 2.70 |
| Totals | 24.30k | 1.00 | | | 157.68 | 1.00 | | | | 66.85 |

Note: The Test Tool Coverage Effectiveness of the Memory and System Controller is 66.85%.

TABLE 4

| | I/O Functions | | | | | | | | | |
|---|---|---|---|---|---|---|---|---|---|---|
| Major Function | CC | NCC | Complx | Imptrtnc | W | NWF | Effect | Complt | CE | TEF |
| BSC | 4k | 0.17 | 50 | 50 | 17.00 | 0.18 | 0 | 0 | 0 | 0 |
| Diskette Controller | 3k | 0.13 | 50 | 50 | 13.00 | 0.14 | 80 | 100 | 80 | 11.20 |
| Ethernet | 3k | 0.13 | 80 | 100 | 23.40 | 0.25 | 90 | 100 | 90 | 22.50 |
| I/O POS Registers | 2k | 0.09 | 10 | 30 | 3.60 | 0.04 | 100 | 100 | 100 | 4.00 |
| Keyboard Speaker Adapter | 2k | 0.09 | 50 | 50 | 9.00 | 0.10 | 100 | 100 | 100 | 10.00 |
| Parallel Port | 0 | 0 | 10 | 50 | 0 | 0 | 100 | 100 | 100 | 0 |
| SCSI | 1k | 0.04 | 80 | 100 | 7.20 | 0.08 | 100 | 100 | 100 | 8.00 |
| Serial Port | 3k | 0.13 | 50 | 50 | 13.00 | 0.14 | 90 | 90 | 81 | 11.34 |
| uChannel Slots | 3k | 0.13 | 10 | 30 | 5.20 | 0.05 | 100 | 100 | 100 | 5.00 |
| Tablet Adapter | 1k | 0.04 | 10 | 30 | 1.60 | 0.02 | 100 | 100 | 100 | 2.00 |
| Miscellaneous | 1k | 0.04 | 10 | 30 | 1.60 | 0.02 | 100 | 100 | 100 | 2.00 |
| Totals | 23k | 1.00 | | | 94.60 | 1.00 | | | | 76.04 |

Note: The Test Tool Coverage Effectiveness of the I/O Functions is 76.04%.

TABLE 5

| | I/O Controller | | | | | | | | | |
|---|---|---|---|---|---|---|---|---|---|---|
| Major Function | C | NCC | Complx | Imptrtnc | W | NWF | Effect | Complt | CE | TEF |
| Bus Master DMA | 4.72k | 0.14 | 80 | 90 | 23.8 | 0.14 | 40 | 100 | 40 | 5.60 |
| Bus Slave DMA | 2.25k | 0.07 | 50 | 80 | 9.10 | 0.05 | 50 | 100 | 50 | 2.50 |
| Bus Monitor for uChannel | 0.075k | 0.002 | 10 | 50 | 0.12 | 0.007 | 0 | 0 | 0 | 0 |
| COP | 0.075k | 0.002 | 30 | 10 | 0.08 | 0.005 | 0 | 0 | 0 | 0 |
| External Bus Trans | 0.15k | 0.004 | 10 | 10 | 0.08 | 0.005 | 0 | 0 | 0 | 0 |
| Full SMP Cache Coherency | 7.50k | 0.23 | 100 | 100 | 46.00 | 0.27 | 30 | 100 | 30 | 8.10 |
| Interface to 601 Bus | 15.00k | 0.46 | 80 | 100 | 82.80 | 0.48 | 50 | 100 | 50 | 24.00 |
| IOCC Commands | 0.75k | 0.02 | 30 | 100 | 2.60 | 0.01 | 50 | 100 | 50 | 0.50 |
| Passing External Interrupts | 0.75k | 0.02 | 30 | 100 | 2.60 | 0.01 | 40 | 100 | 40 | 0.40 |
| PIO Loads & Stores | 0.90k | 0.03 | 40 | 100 | 4.20 | 0.02 | 50 | 100 | 50 | 1.00 |
| Streaming Data Protocols | 0.45k | 0.01 | 60 | 10 | 0.70 | 0.004 | 50 | 100 | 50 | 0.20 |
| Totals | 32.62 | 1.00 | | | 172.08 | 1.00 | | | | 42.3 |

Note: The Test Tool Coverage Effectiveness of the I/O Controller is 42.30%.

TABLE 6

| | Graphics Functions | | | | | | | | | |
|---|---|---|---|---|---|---|---|---|---|---|
| Major Function | CC | NCC | Complx | Imptrtnc | W | NWF | Effect | Complt | CE | TEF |
| Rendering Functions | 88.00k | 0.75 | 100 | 100 | 150.00 | 0.78 | 95 | 20 | 19.00 | 14.82 |
| 601 Bus Interface | 23.00k | 0.20 | 80 | 100 | 36.00 | 0.19 | 92 | 60 | 55.20 | 10.49 |
| VRAM Interface | 5.00k | 0.04 | 60 | 100 | 6.40 | 0.03 | 60 | 40 | 24.00 | 0.72 |
| BLUELAKE Interface | 0.60k | 0.005 | 40 | 100 | 0.70 | 0.004 | 80 | 30 | 24.00 | 0.10 |
| VPD Interface | 0.60k | 0.005 | 20 | 10 | 0.15 | 0.008 | 100 | 0 | 0 | 0 |
| Totals | 117.20k | 1.00 | | | 193.25 | 1.00 | | | | 26.13 |

Note: The Test Tool Coverage Effectiveness of the Graphics Functions is 26.13%.

TABLE 7

| Major Function | Digital to Analog Convertor | | | | | | | | | |
|---|---|---|---|---|---|---|---|---|---|---|
| | CC | NCC | Complx | Imptrtnc | W | NWF | Effect | Complt | CE | TEF |
| DAC Functions | 28.00k | 0.48 | 100 | 100 | 96.00 | 0.57 | 80 | 30 | 24 | 13.68 |
| Phase Lock Loop | 1.00k | 0.02 | 80 | 100 | 3.60 | 0.02 | 80 | 30 | 24 | 0.48 |
| DAC | 4.50k | 0.08 | 60 | 100 | 12.80 | 0.07 | 80 | 0 | 0 | 0 |
| 1Kx8 Palette RAM | 22.00k | 0.38 | 40 | 100 | 53.20 | 0.31 | 90 | 30 | 27 | 8.37 |
| Global RAM | 2.00k | 0.03 | 20 | 100 | 3.60 | 0.02 | 90 | 30 | 27 | 0.54 |
| Totals | 58.00k | 1.00 | | | 169.20 | 1.00 | | | | 23.07 |

Note: The Test Tool Coverage Effectiveness of DAC is 23.07%.

Based on this analysis, the overall test coverage effectiveness of the test tool on the six components for the data collected is 41.02%. The test coverage effectiveness of the Memory Controller, the Memory and System Controller, the I/O Functions, the I/O Controller, the Graphics Functions and the Digital to Analog Convertor is 83.26%, 66.85%, 76.04%, 42.30%, 26.13% and 23.07%, respectively. The results shown in Table 2 on page 12 through Table 7 indicate that for the purpose of achieving higher coverage effectiveness, more emphasis in the test tool should be placed in the I/O Controller, Graphics Functions and the Digital to Analog Convertor areas.

The results also show the functions that require emphasis, such as the 'ECC' in the Memory Controller, the 'Page Mode Address Control' in the Memory and System Controller, the 'Full SMP Cache Coherency' in I/O Controller, the 'Rendering Functions' in the Graphics Functions and the 'DAC Functions' in the Digital to Analog Convertor.

Although, in some cases, functions may show a low Test Coverage Effectiveness (TEF), such as the 'Chip I/O Boundary' in the Memory Controller with a TEF of 0 and the 'Bus Monitor for the uChannel' in the I/O Controller with a TEF of 0, it can be concluded based on the data shown in the tables that the weights of these functions (4% for 'Chip I/O Boundary' and 0.7% for the 'Bus Monitor for the uChannel') may not be significant enough to warrant additional test case development effort.

The data collection may allow for some variability in evaluating some of the parameters, such as the Complexity, the Importance, and the test case Effectiveness. However, it is our view that because the data is collected at the lowest level of detail possible (i.e. the Effectiveness of a test case, or group of test cases, for a function within a component), the variability in the data collection should not be very significant.

For the major components, or functions, that could not be tested under the test tool chosen for this example, provisions could be made to test the functions using other means (i.e. other tools). The progress of the test activities could be assessed using this methodology, and the results may be folded with this data. To this end, all areas of weakness (i.e. tested by this test tool and require more emphasis or not tested by this tool at all) should be included in a "Risk Assessment" document and emphasized in the test phases to follow.

As indicated earlier, this methodology can be expanded to include a number of tools. This can be done by weighing all the tools to be used during a test cycle, assigning a relative weight to each tool, assessing the Test Coverage Effectiveness of each tool and determining the overall test coverage of all tools and consequently the entire test cycle.

The Preferred Embodiment

FIGS. 1 and 2 depict, in the form of a flowchart, an exemplary process for assessing the effectiveness of test tools used in the testing of computer systems.

The depicted process illustrated in FIGS. 1 and 2 may be readily implemented by those skilled in the art as a set of computer programs, that together with the digital processing means on which the software is executed, constitute means for performing the various functions depicted in the Figures.

According to the exemplary process depicted in FIGS. 1 and 2, the assessment of the effectiveness of test tools used in the testing of computer systems includes the steps of: (a) sub-dividing the computer system into plurality of functional components (as shown at block 10); determining, for each of the functional components, a set of numbers each corresponding to a plurality of factors indicating the effectiveness of the test tool (as shown at block 20); inputting factors into database (as shown at block 30); computing, based on the determined numbers, a normalized weight of the set of numbers for each of the functional components (as shown at block 40); computing, based on the normalized weight for each of the functional components, a component test value for the test effectiveness of the test tool in testing each of the functional components (as shown at block 50); computing, based on the normalized weight and the component test value for each of the functional components, an overall test value for the test effectiveness of the test tool in testing the computer system hardware (as shown at block 60); and display results, assess overall Coverage Effectiveness and modify the test tool to improve the test effectiveness, based on the component test values and the overall test value (as shown at Blocks 70 and 80).

The exemplary process depicted in FIG. 1 (at block 10) sub-divides the computer system into functional components performing unique tasks and developed by a single developer or a contiguous team of developers. For each component, determine the number of circuits; the Importance; and the Complexity of the design effort. The Importance and Complexity values are established by interviewing the computer system lead engineer. During the interviews, the lead engineer is asked to attribute a value between 0 and 100 for every component reflecting his/her perception of the Importance and Complexity of each component with respect to the rest of the components in a system. The number 100 is used to associate with the most important, or most complex, component. On the other hand, the number 0 is used to associate with the least important, or least complex, component. Numbers between 0 and 100 are used to associate a component with the varying degrees of Importance and Complexity with respect to the other components in a system.

The number of circuits, the Importance and the Complexity values are entered into a spread sheet (shown in FIG. 1 at block 30). Based on the number of circuits, the Importance and the Complexity values, the normalized weight (shown in FIG. 1 at block 40), of each component, $NWC_i$, is evaluated as follows:

$$NWC_i = \frac{W_i}{W_1 + W_2 + \ldots + W_n} \quad (1)$$

Where, $$W_i = NCC_i \left( \frac{Complexity_i + Importance_i}{2} \right) \quad (2)$$

$$NCC_i = \frac{CC_i}{CC_1 + CC_2 + \ldots + CC_n} \quad (3)$$

In Equations (1), (2) and (3), $W_i$ is the weight of component i, $$\left( \frac{Complexity_i + Importance_i}{2} \right)$$

is the average of Complexity and Importance (i.e. each is given equal weight in determining the relative weight of component i), $NCC_i$ is the Normalized circuit count of component i, $CC_i$ is the circuit count of component i and n is the total number of components.

To establish the test coverage effectiveness at the function level (shown in FIG. 1 at block 20), list the major functions of each component (for an example, refer to Table 2 on page 12), assess the number of circuits, assess the Importance and Complexity values of each function. The major functions of a component, and the number of circuits, the Importance and Complexity values of each function are established by interviewing the primary hardware designer of a major component. The criteria for assigning Importance and Complexity values for each function is the same as the one applied in the component's section.

Based on the number of circuits, the Importance points and the Complexity points, the normalized weight of each function, $NWF_i$ is evaluated as follows:

$$NWF_i = \frac{W_i}{W_1 + W_2 + \ldots + W_n} \quad (4)$$

In Equation (4), $W_i$ is the weight of function i and is evaluated by applying Equation (2), where $$\left( \frac{Complexity_i + Importance_i}{2} \right)$$

is the average of Complexity and Importance of function i, $NCC_i$ is the Normalized circuit count of function i and is evaluated by (3), $CC_i$ is the circuit count of function i and n is the total number of functions in a component.

When the normalized weights, $NWF_i$, are established, the stand-alone test cases for each function of a component are identified and mapped to their respective functions. For each group of test cases, or a single test case, mapped to a function, the "Effectiveness" and the "Code Completeness" is assessed. The entire test tool, as well as the identified test cases, are used to evaluate how well a function is tested. When considering the test cases Effectiveness, the test cases' programmers and the corresponding function developers are interviewed and asked to attribute a number between 0 and 100 reflecting their perception of how effective a group of test cases is in testing a function based on:

1. The level of coverage of a function (i.e. how much coverage),
2. The quality of coverage of a function (i.e. how good the covered areas are tested).

Where, 100 indicates that a group of test cases is highly effective and 0 indicates that they are not effective at all.

The Code Completeness of a group of test cases for a function (shown in FIG. 1 at block 20), is determined by interviewing the test cases' programmers and asking them to attribute a number between 0 and 100 reflecting their perception of how complete a group of test cases are based on the overall target. Where, 100 indicates that a group of test cases is all coded and 0 indicates that the coding effort did not start yet.

Based on the test case Effectiveness and Completeness, the Current Effectiveness of a function is determined as follows:

$$CE_i = Effectiveness_i \times \left( \frac{Completeness_i}{100} \right) \quad (5)$$

In Equation (5), $CE_i$ is the Current Effectiveness of function i on a given date, $Effectiveness_i$ is the test case Effectiveness of function i and $Completeness_i$ is the test case Completeness of function i on a given date.

The Test Coverage Effectiveness of function i is determined as follows:

$$TEF_i = CE_i \times NWF_i \quad (6)$$

In Equation (6), $TEF_i$ is the Test Coverage Effectiveness of function i, $CE_i$ is the Current Effectiveness of function i and $NWF_i$ is the normalized weight of function i.

The Maximum Test Coverage Effectiveness of function i, $MTEF_i$, signifies the maximum test coverage achievable with the current plan and is derived from Equation (5) where Completeness is equal to 100. $MTEF_i$ is evaluated as follows:

$$MTEF_i = Effectiveness_i \times NWF_i \quad (7)$$

The Test Coverage Effectiveness of a component (shown in FIG. 2 at block 50) j, $TEC_j$, is the sum of $TEF_j$ for all the individual functions. It is established as follows:

$$TEC_j = \sum_{i=1}^{m} TEF_i \quad (8)$$

In Equation (8), $TEC_j$, is the Test Coverage Effectiveness of component j, and m is the total number of functions in component j.

The Maximum Test Coverage Effectiveness of component j is determined as follows:

$$MTEC_j = \sum_{i=1}^{m} MTEF_i \quad (9)$$

The Test Coverage Effectiveness of component j, $TEC_j$ is applied to determine the relative Test Coverage Effectiveness of component j, $TECR_j$, as follows:

$$TECR_j = TEC_j \times NWC_j \quad (10)$$

From Equations (5), (6), (8) and (10) the Test Coverage Effectiveness of a system (shown in FIG. 2 at block 60), TES, is determined as follows:

$$TES = \sum_{j=1}^{k} TECR_j \quad (11)$$

In Equation (11), k is the total number of components considered.

The overall results in the spread sheet are displayed and analyzed (shown in FIG. 2 at block 70). Based on the overall Coverage Effectiveness, the test tool is modified to improve the test effectiveness (shown in FIG. 2 at block 80).

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A method for use with a test tool in a digital computer system comprising the steps of:

dividing a data processing system of a machine being designed and tested into a plurality of components for performing unique tasks;

determining normalized component weights for each of said plurality of components;

determining a component test value for indicating test effectiveness of a test tool in testing a component for each said component;

calculating an overall test value of said test tool by weighting said component test values by said normalized component weights;

modifying said test tool to improve said overall test value and to improve said component test values for said machine being designed and tested.

2. The method of claim 1 wherein said normalized component weights are determined from a step of entering a component circuit count, a step of entering a first value indicating a relative complexity of a component with respect to said plurality of components, and an additional step of entering a second value indicating a relative importance of said component with respect to said plurality of components.

3. The method according to claim 1 wherein said normalized component weights are determined by:

$$NWC_i = \frac{W_i}{W_1 + W_2 + \ldots + W_n} \quad (1)$$

$$W_i = NCC_i \left( \frac{Complexity_i + Importance_i}{2} \right) \quad (2)$$

$$NCC_i = \frac{CC_i}{CC_1 + CC_2 + \ldots + CC_n} \quad (3)$$

(Wherein $NWC_i$ is the Normalized Component Weight of component i, $W_i$ is the weight of component i, $Complexity_i$ is a relative complexity of a component with respect to all other components, $Importance_i$ is a relative importance of a component with respect to all other components, $NCC_i$ is the Normalized circuit count of component i, $CC_i$ is the circuit count of component i and n is the total number of components).

4. The method according to claim 1 further comprising:

subdividing each of said components into a plurality of functions;

determining normalized function weights for each of said plurality of functions;

determining a function test value for indicating test effectiveness of a test tool in testing a function for each said function;

calculating said component test value by weighting said function test values by said normalized function weights.

5. The method of claim 4 wherein said normalized function weights are determined from a step of entering a function circuit count, a step of entering a first value indicating a relative complexity of a function with respect to said plurality of functions, and an additional step of entering a second value indicating a relative importance of said function with respect to said plurality of functions.

6. The method according to claim 4 wherein said normalized function weights are determined by:

$$NWF_i = \frac{W_i}{W_1 + W_2 + \ldots + W_n} \quad (1)$$

$$W_i = NCC_i \left( \frac{Complexity_i + Importance_i}{2} \right) \quad (2)$$

$$NCC_i = \frac{CC_i}{CC_1 + CC_2 + \ldots + CC_n} \quad (3)$$

(Wherein $NWF_i$ is the Normalized Function Weight of function i, $W_i$ is the weight of function i, $Complexity_i$ is a relative complexity of a function with respect to all other functions, $Importance_i$ is a relative importance of a function with respect to all other functions, $NCC_i$ is the Normalized circuit count of function i, $CC_i$ is the circuit count of function i and n is the total number of functions in a component).

7. The method according to claim 4 wherein said component test value is calculated by:

(a) respectively associating a plurality of test cases associated with said test tool to said plurality of functions to result in a testing means for each function;

(b) determining a testing means effectiveness for each function;

(c) determining a testing means completeness for indicating completion status of said testing means for each function;

(d) calculating a current effectiveness for each function where current effectiveness is given by:

$$CE_i = Effectiveness_i \times \left( \frac{Completeness_i}{100} \right)$$

(Wherein $CE_i$ is the Current Effectiveness of function i on a given date, $Effectiveness_i$ is the testing means Effectiveness of function i and $Completeness_i$ is the testing means Completeness of function i on a given date);

(e) calculating a component test value where component test value is given by:

$$TEF_i = CE_i \times NWF_i \quad (1)$$

$$TEC_j = \sum_{i=1}^{m} TEF_i \quad (2)$$

(Wherein $TEF_i$ is the Test Coverage Effectiveness of function i, $CE_i$ is the Current Effectiveness of function i, $NWF_i$ is the normalized weight of function i, $TEC_j$, is the component test value of component j, and m is the total number of functions in component j).

8. The method according to claim 7 wherein said testing means effectiveness is determined by assessing testing means coverage and testing means coverage quality for said function.

9. The method according to claim 7 wherein a maximum function test coverage effectiveness for indicating the maximum achievable test coverage of a function is determined by:

$$MTEF_i = Effectiveness_i \times NWF_i$$

(Wherein $MTEF_i$ is the Maximum Test Coverage Effectiveness of function i, $Effectiveness_i$ is the testing means Effectiveness of function i, and $NWF_i$ is the normalized weight of function i).

10. The method according to claim 7 wherein said testing means comprises a single test case.

11. The method according to claim 7 wherein said testing means comprises a group of test cases.

12. The method according to claim 1 wherein said overall test value is calculated by $$TECR_j = TEC_j \times NWC_j \tag{1}$$

$$TES = \sum_{j=1}^{k} TECR_j \tag{2}$$

(Wherein $TECR_j$ is the Test Coverage Effectiveness of component j, $TEC_j$, is the component test value of component j, $NWC_i$ is the Normalized Component Weight of component i, TES is the overall test value and k is the total number of components considered).

13. The method according to claim 7 wherein a maximum component test coverage effectiveness for indicating the maximum achievable test coverage of a component is determined by:

$$MTEC_j = \sum_{i=1}^{m} MTEF_i \tag{9}$$

(Wherein $MTEC_j$ is the Maximum Test Coverage Effectiveness of component j, and $MTEF_i$ is the Maximum Test Coverage Effectiveness of function i).

14. A method for use with a test tool in a digital computer system comprising the steps of:
dividing a data processing system of a machine being designed and tested into a plurality of components for performing unique tasks;
subdividing each of said components into a plurality of functions;
determining normalized function weights for each of said plurality of functions by:

$$NWF_i = \frac{W_i}{W_1 + W_2 + \ldots + W_n} \tag{1}$$

$$W_i = NCC_i \left( \frac{Complexity_i + Importance_i}{2} \right) \tag{2}$$

$$NCC_i = \frac{CC_i}{CC_1 + CC_2 + \ldots + CC_n} \tag{3}$$

(Wherein $NWF_i$ is the Normalized Function Weight of function i, $W_i$ is the weight of function i, $Complexity_i$ is a relative complexity of a function with respect to all other functions, $Importance_i$ is a relative importance of a function with respect to all other functions, $NCC_i$ is the Normalized circuit count of function i, $CC_i$ is the circuit count of function i and n is the total number of functions in a component);
determining a function test value for indicating test effectiveness of a test tool in testing a function for each said function;
calculating a component test value by:
(a) respectively associating a plurality of test cases associated with said test tool to said plurality of functions to result in a testing means for each function;

(b) determining a testing means effectiveness for each function;
(c) determining a testing means completeness for indicating completion status of said testing means for each function;
(d) calculating a current effectiveness for each function where current effectiveness is given by:

$$CE_i = Effectiveness_i \times \left( \frac{Completeness_i}{100} \right)$$

(Wherein $CE_i$ is the Current Effectiveness of function i on a given date, $Effectiveness_i$ is the testing means Effectiveness of function i and $Completeness_i$ is the testing means Completeness of function i on a given date);
(e) calculating a component test value where component test value is given by:

$$TEF_i = CE_i \times NWF_i \tag{1}$$

$$TEC_j = \sum_{i=1}^{m} TEF_i \tag{2}$$

(Wherein $TEF_i$ is the Test Coverage Effectiveness of function i, $CE_i$ is the Current Effectiveness of function i, $NWF_i$ is the normalized weight of function i, $TEC_j$, is the component test value of component j, and m is the total number of functions in component j);
determining normalized component weights for each of said plurality of components by:

$$NWC_i = \frac{W_i}{W_1 + W_2 + \ldots + W_n} \tag{1}$$

$$W_i = NCC_i \left( \frac{Complexity_i + Importance_i}{2} \right) \tag{2}$$

$$NCC_i = \frac{CC_i}{CC_1 + CC_2 + \ldots + CC_n} \tag{3}$$

(Wherein $NWC_i$ is the Normalized Component Weight of component i, $W_i$ is the weight of component i, $Complexity_i$ is a relative complexity of a component with respect to all other components, $Importance_i$ is a relative importance of a component with respect to all other components, $NCC_i$ is the Normalized circuit count of component i, $CC_i$ is the circuit count of component i and n is the total number of components);
calculating an overall test value of said test tool by:

$$TECR_j = TEC_j \times NWC_j \tag{1}$$

$$TES = \sum_{j=1}^{k} TECR_j; \tag{2}$$

(Wherein $TECR_j$ is the Test Coverage Effectiveness of component j, $NWC_j$ is the Normalized Component Weight of component i, TES is the overall test value and k is the total number of components considered); and
modifying said test tool to improve said overall test value and to improve said component test values for said machine being designed and tested.

* * * * *

UNITED STATES PATENT AND TRADEMARK OFFICE
CERTIFICATE OF CORRECTION

PATENT NO. : 5,631,857
DATED      : May 20, 1997
INVENTOR(S): Kobrosly et al.

It is certified that error appears in the above-identified patent and that said Letters Patent are hereby corrected as shown below:

Column 16, Line 56      "$NWC_j$" should be --$NWC_i$--
Claim 14

Signed and Sealed this

Twenty-first Day of October 1997

Attest:

BRUCE LEHMAN

Attesting Officer      Commissioner of Patents and Trademarks